(12) United States Patent
Daubenspeck et al.

(10) Patent No.: US 6,924,210 B1
(45) Date of Patent: Aug. 2, 2005

(54) CHIP DICING

(75) Inventors: Timothy H. Daubenspeck, Colchester, VT (US); William T. Motsiff, Essex Junction, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,487

(22) Filed: Mar. 6, 2004

(51) Int. Cl.[7] ............................................... H01L 21/46
(52) U.S. Cl. ........................ 438/460; 438/458; 438/462
(58) Field of Search ................................. 438/458, 460, 438/461, 462, 463, 464, 465

(56) References Cited

U.S. PATENT DOCUMENTS

| | | |
|---|---|---|
| 5,151,389 A | 9/1992 | Zappella |
| 5,214,261 A | 5/1993 | Zappella |
| 5,870,421 A | 2/1999 | Dahm |
| 6,030,885 A * | 2/2000 | Bothra ........................ 438/460 |
| 6,498,074 B2 | 12/2002 | Siniaguine et al. |
| 6,555,447 B2 | 4/2003 | Weishauss et al. |
| 6,600,213 B2 | 7/2003 | Brouillette et al. |

* cited by examiner

*Primary Examiner*—Kevin M. Picardat
(74) *Attorney, Agent, or Firm*—Schmeiser, Olsen & Watts; William D. Sabo

(57) ABSTRACT

A method and structure for cutting semiconductor chips from a wafer (dicing). For each chip of the wafer, a laser beam is used to cut around the chip along a plurality of straight-line cut segments such that the formed corners of the chip after cutting are all greater than 90°. As a result, the stress at these corners are much less than that of prior art chips, especially during packaging step. In one embodiment, the laser beam is used to cut along only straight-line cut segments not on any chip boundary line, and a saw blade is used to cut along all the chip boundary lines.

20 Claims, 3 Drawing Sheets

CHIP DICING

BACKGROUND OF INVENTION

1. Technical Field

The present invention relates to chip dicing methods, and more particularly, to a chip dicing method that yields chip less susceptible to cracking.

2. Related Art

In fabricating semiconductor chips, in order to reduce interconnect RC (Resistance-Capacitance) delays, reduce crosstalk between adjacent metal lines, and reduce power consumption of the chips, low-K (K is dielectric constant) materials are used as dielectric materials instead of traditional dielectric materials such as silicon dioxide. However, low-K materials are generally more brittle and less adhesive than traditional dielectric materials. This aggravates the cracking problem during the packaging step. The cracking problem happens when different layers of a chip separate, especially at the chip's corners, due to thermal expansion mismatch of materials of the different layers of the chip. This cracking problem is more likely to occur during the packaging step because this step usually involves subjecting the chip to different temperatures in order to thermally cure some materials in the chip. It has been determined that this cracking problem usually happens at corners of the chip where stress is greatest compared with the remaining region of the chip.

Therefore, there is a need for a structure of a novel semiconductor chip that is less susceptible to cracking than that of prior art. Also, there is a need for a method for fabricating the novel semiconductor chip.

SUMMARY OF INVENTION

The present invention provides a method for cutting a chip from a wafer. The method comprises the step of cutting around the chip along a plurality of straight-line cut segments such that all resulting corners of the chip after cutting have an angle greater than 90°.

The present invention also provides a semiconductor chip structure. The structure comprises a plurality of straight-line cut segments around the chip such that all angles of corners of the chip are greater than 90°.

The present invention also provides a method of dicing, comprising the steps of (a) providing a wafer comprising a plurality of chips sharing chip boundary lines, and (b) for each chip of the plurality of chips, cutting around the chip along a plurality of straight-line cut segments such that resulting corners of the chip after cutting are all greater than 90°.

DETAILED DESCRIPTION

The semiconductor industry generally refers to K (dielectric constant) values below 3.9 (which is the K value of SiO2) as low. Although the present invention is most useful for the case where K<3.5, the present invention is applicable for any value of K.

Figure 1:
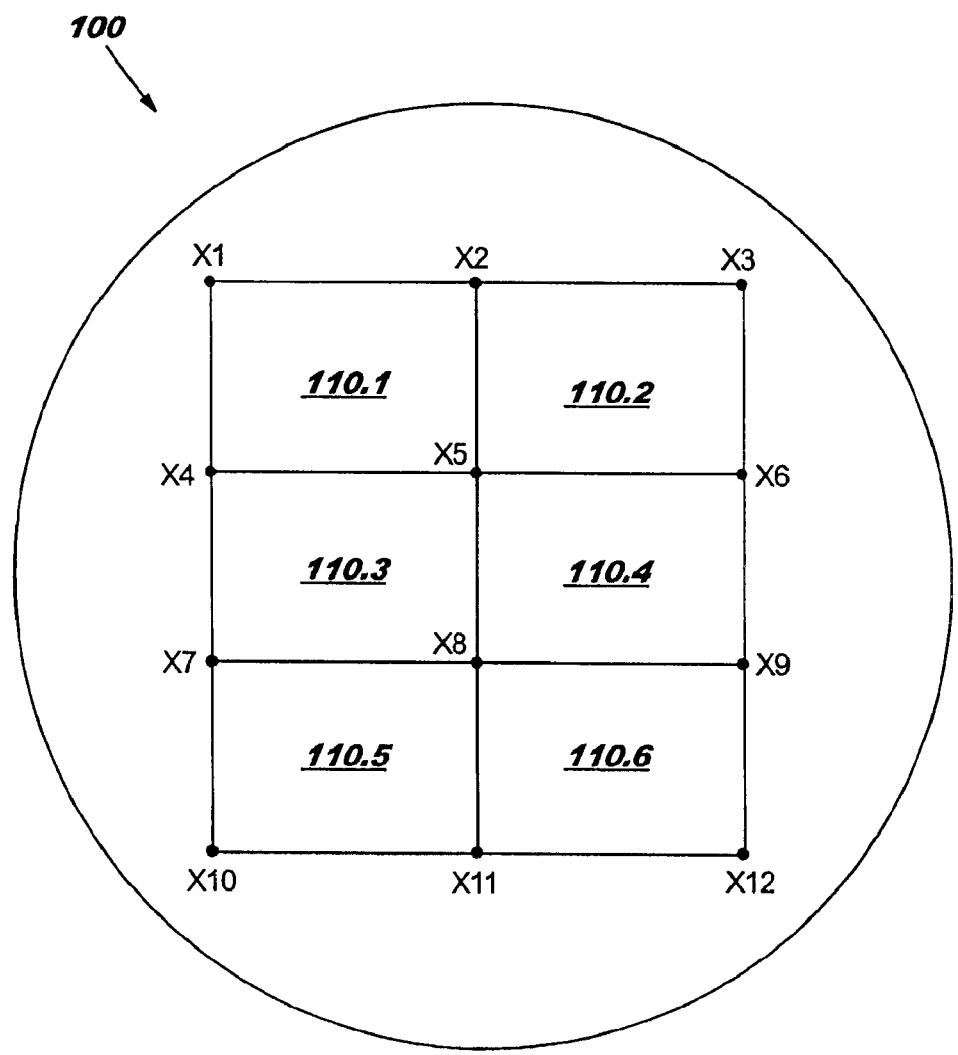
FIG. 1 illustrates a top view of a wafer comprising multiple chips, in accordance with embodiments of the present invention.

FIG. 1 illustrates a top view of a wafer 100, in accordance with embodiments of the present invention. Illustratively, the wafer 100 comprises six chips 110.1, 110.2, 110.3, 110.4, 110.5, and 110.6. The chip 110.1 has a rectangular shape with four right-angle chip boundary corners X1, X2, X5, and X4. Each of the other chips 110.2, 110.3, 110.4, 110.5, and 110.6 has a similar shape. The chips 110.1, 110.2, 110.3, 110.4, 110.5, and 110.6 are identical and are arranged in three rows and two columns.

Figure 2:
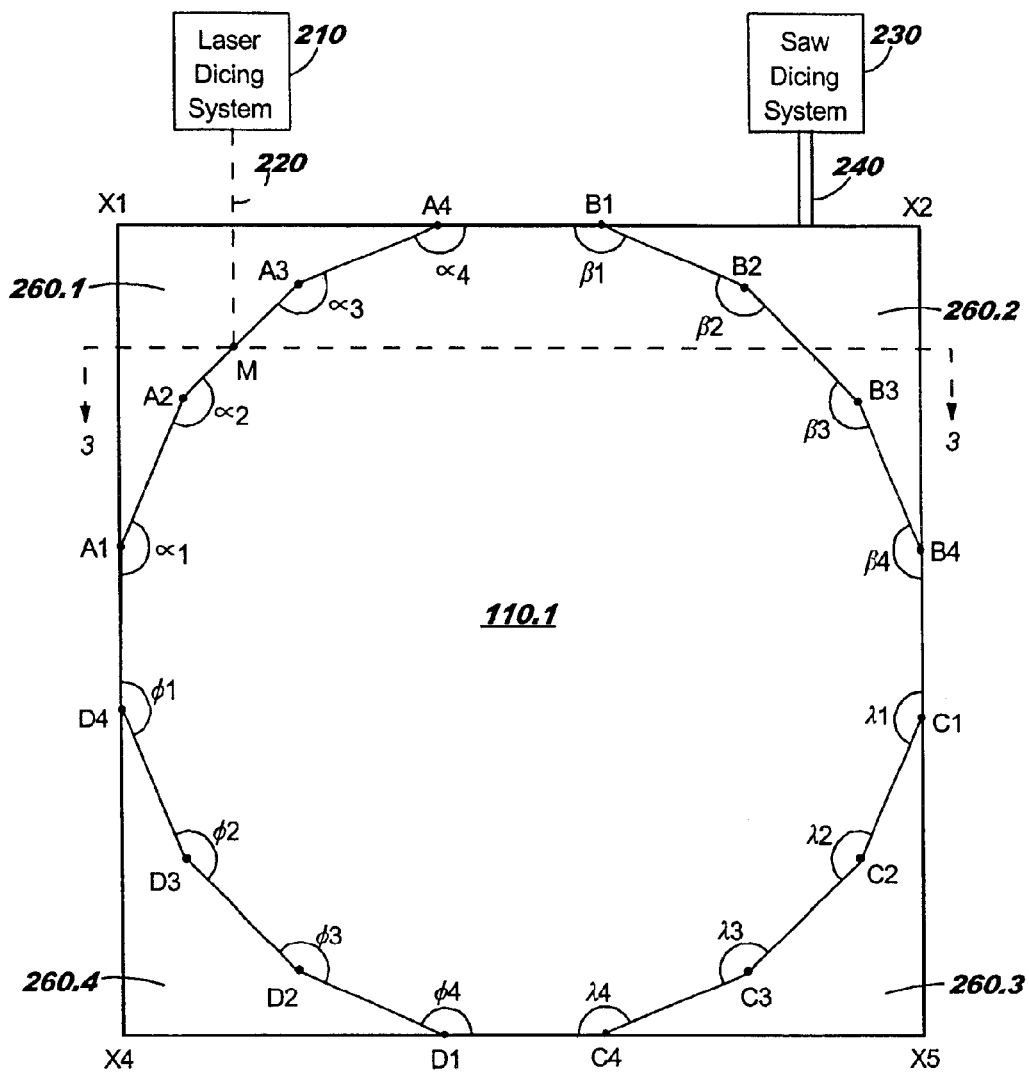
FIG. 2 illustrates a top view of one of the chips of FIG. 1, in accordance with embodiments of the present invention.

FIG. 2 illustrates a top view of the chip 110.1 of FIG. 1, in accordance with embodiments of the present invention. In one embodiment, a laser beam 220 generated by a laser dicing system 210 is used to cut the chip 110.1 out from the wafer 100 (FIG. 1). The other chips 110.2, 110.3, 110.4, 110.5, and 110.6 (FIG. 1) are cut out of the wafer 100 in a similar manner. In one embodiment, the cutting (i.e., dicing) of the chip 110.1 out of the wafer 100 goes through from top to bottom of the wafer 100 (i.e., through the entire thickness of the wafer 100).

In one embodiment, the cutting starts at point A1 and continuously goes through points A2, A3, A4, B1, B2, B3, B4, C1, C2, C3, C4, D1, D2, D3, D4, and returns to point A1, in a series of straight-line cut segments around the chip 110.1. It can be seen that all the resulting corners A1, A2, A3, A4, B1, B2, B3, B4, C1, C2, C3, C4, D1, D2, D3, and D4 of the chip 110.1 are less sharp than in prior art where chips have 90° (right-angle) corners. In other words, all the angles of the resulting corners A1, A2, A3, A4, B1, B2, B3, B4, C1, C2, C3, C4, D1, D2, D3, and D4 of the chip 110.1 are greater than 90°. The angle of a chip corner is defined by two consecutive straight-line cut segments accepting that chip corners as a common point. For example, the angle $\alpha 1$ of the chip corner A1 is defined by two consecutive straight-line cut segments D4A1 and A1A2 which accept the chip corner A1 as a common point. As a result of the angles of the resulting chip corners being less sharp, stress between different layers of the chip 110.1 at its corners after dicing (i.e., after being cut from the wafer) is reduced. Therefore, during packaging or other processes involving temperatures changes, the chip 110.1 is less likely to crack at its corners than those of prior art.

In one embodiment, at each of the original right-angle chip boundary corners X1, X2, X5, and X4 of the chip 110.1, the cutting goes through straight-line cut segments of equal lengths and makes a change in direction at the same angle. For instance, at point A1, the cutting can steer to the right 22.5° (i.e., 90°/4) from the northern direction and continuously goes to A2. At point A2, the cutting can steer to the right 22.5° from the current direction and continuously goes to A3. At point A3, the cutting can steer to the right 22.5° from the current direction and continuously goes to A4. At point A4, the cutting can steer to the right 22.5° from the current direction and continuously goes to B1, and so on until the cutting returns to point A1. Here, all the cut segments A1A2, A2A3, A3A4, B1B2, B2B3, B3B4, C1C2, C2C3, C3C4, D1D2, D2D3, and D3D4 are equal in length. As a result, the angles of the resulting chip corners A1, A2, A3, A4, B1, B2, B3, B4, C1, C2, C3, C4, D1, D2, D3, and D4 are equal (i.e., $\alpha 1 = \alpha 2 = \alpha 3 = \alpha 4 = \beta 1 = \beta 2 = \beta 3 = \beta 4 = \lambda 1 = \lambda 2 = \lambda 3 = \lambda 4 = \phi 4 = \phi 3 = \phi 2 = \phi 1$).

In one embodiment, the cutting described supra is all performed by the laser beam 220 generated by the laser dicing system 210. After the chip 110.1 is cut out from the wafer 100, the other chips 110.2, 110.3, 110.4, 110.5, and 110.6 are also cut out, one after another, from the wafer 100 in a similar manner.

In an alternative embodiment, the cutting does not have to be finished with one chip before moving to the next chip. The cutting can leave a chip unfinished and later come back to that chip to cut it out. For example, the cutting can be performed for some segments of a first chip, then for some segments of a second chip, then back for some other segments of the first chip, and so on.

In one embodiment, the cutting does not go continuously as described above. For instance, the cutting can start at A1 and go continuously to A2. Then, the cutting can jump to point B1 and go continuously to B2.

In one embodiment, the cutting is performed in the same manner as described above except that the straight-line cut segments on the chip boundaries abutting neighboring chips are left out (intact) so that they (the left out straight-line cut segments) can be cut later using other less expensive methods. For instance, a saw dicing system 230 (FIG. 2) having a saw blade 240 can be used to cut along the chip boundary lines and through the entire thickness of the wafer 100. More specifically, for the wafer 100 of FIG. 1, after the laser dicing is done for the straight-line cut segments not on the chip boundary lines, the saw dicing system 240 can be used to make 4 horizontal straight-line cuts along 4 horizontal chip boundary lines X1X3, X4X6, X7X9, and X10X12 and make 3 vertical straight-line cuts along 3 vertical chip boundary lines X1X10, X2X11, and X3X12 across the wafer 100. As a result, with reference to FIGS. 1 and 2, the straight-line cut segments D4A1, A4B1, B4C1, and C4D1 of the chip 110.1 which are on the chip boundary lines X1X10, X1X3, X2X11, and X4X6, respectively, are cut through by the saw blade 240.

Figure 3:
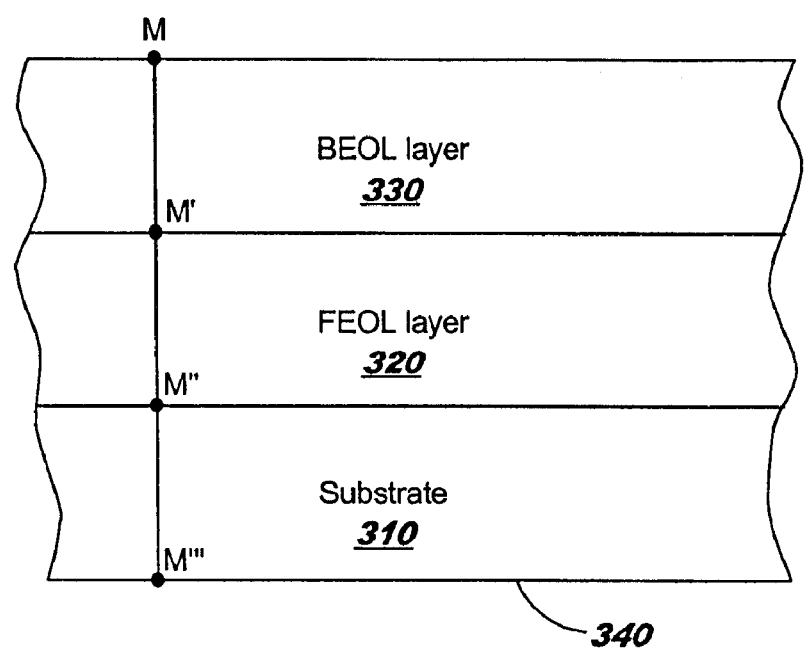
FIG. 3 illustrates a cross sectional view of the chip of FIG. 2, in accordance with embodiments of the present invention.

FIG. 3 illustrates a cross sectional view along line 3—3 of the chip 110.1 of FIG. 2, in accordance with embodiments of the present invention. Illustratively, the chip 110.1 has an substrate layer 310, an FEOL (Front End of Line) layer 320, and a BEOL (Back End of Line) layer 330. The FEOL layer 320 comprises devices of the chip 110.1 (transistors, resistors, etc.) The BEOL layer 330 comprises interconnect system (wires and dielectric regions isolating the wires). Low-K materials are usually used in the BEOL layer 330. As a result, the BEOL layer 330 is susceptible to cracking the most (compared with other layers 310 and 320 of the chip 110.1).

In the embodiments, for the chip 110.1, while the laser beam 220 cuts through the segments A1A2, A2A3, A3A4, A4B1, B1B2, B2B3, B3B4, B4C1, C1C2, C2C3, C3C4, C4D1, D1D2, D2D3, D3D4, and D4A1 (FIG. 2) in any order, the laser beam 220 cuts deep down through the entire thickness of the chip 110.1. For instance, at point M (FIGS. 2 and 3), the laser beam 230 cuts from top point M deep down to point M'''' at the bottom 340 of the chip 110.1 (FIG. 3).

In an alternative embodiment, for the chip 110.1, while the laser beam 220 cuts, in any order, through the segments A1A2, A2A3, A3A4, B1B2, B2B3, B3B4, C1C2, C2C3, C3C4, D1D2, D2D3, and D3D4 (FIG. 2) which are not on the chip boundary lines, the laser beam 220 cuts deep down through the entire thickness of the chip 110.1. Then, the other chips 110.2, 110.3, 110.4, 110.5, and 110.6 are cut in a similar manner. Finally, while the saw blade 240 makes 4 horizontal straight-line cuts along the chip boundary lines X1X3, X4X6, X7X9, and X10X12 and 3 vertical straight-line cuts along the chip boundary lines X1X10, X2X11, and X3X12, the saw blade 240 cuts deep down through the entire thickness of the wafer 100 (FIG. 3).

In yet another alternative embodiment, while the laser beam 220 cuts, in any order, through the segments A1A2, A2A3, A3A4, B1B2, B2B3, B3B4, C1C2, C2C3, C3C4, D1D2, D2D3, and D3D4 (FIG. 2) which are not on the chip boundary lines, the laser beam 220 cuts only as deep as the BEOL layer 330 of the chip 110.1. For instance, at point M, the laser beam 230 cuts from top point M down to only point M'' (FIG. 3). As a result, dicing can be performed faster than if cutting were through the entire chip thickness. Then, the other chips 110.2, 110.3, 110.4, 110.5, and 110.6 are cut in a similar manner. Finally, while the saw blades 240 makes 4 horizontal straight-line cuts along the chip boundary lines X1X3, X4X6, X7X9, and X10X12 and 3 vertical straight-line cuts along the chip boundary lines X1X10, X2X11, and X3X12, the saw blade 240 cuts deep down through the entire thickness of the wafer 100 (FIG. 3). As a result, the laser-cut segments A2A2, A2A3, A3A4, B1B2, B2B3, B3B4, C1C2, C2C3, C3C4, D1D2, D2D3, and D3D4 (FIG. 2) form four crack propagation prevention channel 250.1, 250.2, 250.3, and 250.4 in the BEOL layer 330. Any crack occurring at the sharp chip boundary corners X1, X2, X5, and X4 in the BEOL layer 330 (FIG. 3) and expanding through the corner regions 260.1, 260.2, 260.3, and 260.4 (FIG. 2) will be stopped by the crack propagation prevention channel 250.1, 250.2, 250.3, and 250.4, respectively.

In one embodiment, the wafer 100 is thinned by polishing its bottom surface 340 (FIG. 3) before using laser beam 220 for dicing. As a result of decreased wafer thickness, it takes less time for the laser beam 220 to make the cuts.

In the embodiments described above, the wafer 100 has 6 chips 110.2, 110.3, 110.4, 110.5, and 110.6. In general, the wafer can have any number of chips.

In the embodiments described above, the cutting at the four right-angle chip boundary corners X1, X2, X5, and X4 of the chip 110.1 are performed in the same manner. The result is shown in FIG. 2. Alternatively, the cutting at each of the four right-angle chip boundary corners X1, X2, X5, and X4 of the chip 110.1 can be performed in a unique manner. For example, at the right-angle chip boundary corner X2, the cutting can go through 9 straight-line cut segments instead of 4. More specifically, at point B1, the cutting can steer to the right 10° (i.e., 90°/9) from the eastern direction and continuously goes to B2. At point B2, the cutting can steer to the right 10° from the current direction and continuously goes to B3, and so on until the cutting reaches point B10 (not shown) such that B1B2, B2B3, . . . , and B9B10 are equal in length. In general, at each of the right-angle chip boundary corners X1, X2, X5, and X4 of the chip 110.1, the cutting can go through N equal, straight-line cut segments (N is an integer greater than 1). Moreover, N can change from one right-angle chip boundary corner to another.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A chip separation method comprising:
 providing a wafer comprising a chip, the chip comprising a close-loop boundary line consisting of N straight-line chip boundary lines shared with N other chips on the wafer, N being a positive integer greater than 2; and
 cutting around the chip along M straight-line cut segments on the chip, M being a positive integer, wherein M>N.

2. The method of claim 1, wherein the angles of all corners of the chip after cutting are equal, wherein each corner of the corners of the chip after cutting is defined by two consecutive straight-line cut segments of the M straight-line cut segments.

3. The method of claim 1, wherein at least two consecutive straight-line cut segments of the M straight-line cut segments which are not on the N straight-line chip boundary lines are of a same length.

4. The method of claim 1, wherein all the straight-line cut segments of the M straight-line cut segments which are not on the N straight-line chip boundary lines are of a same length.

5. The method of claim 1, wherein said cutting around the chip along the M straight-line cut segments comprises:

cutting, with a laser beam, along the straight-line cut segments of the M straight-line cut segments which are not on the N straight-line chip boundary lines, and cutting, with a saw blade, along the straight-line cut segments of the M straight-line cut segments which are on the N straight-line chip boundary lines of the chip.

6. The method of claim 1, wherein the cutting goes as deep as the entire thickness of the chip along the plurality of straight-line cut segments.

7. The method of claim 1, wherein the cutting goes as deep as the entire thickness of the chip along the straight-line cut segments of the M straight-line cut segments which are on the N straight-line chip boundary lines of the chip, and wherein the cutting goes only as deep as a Back End Of Line (BEOL) layer along the straight-line cut segments of the M straight-line cut segments which are not on any chip boundary line.

8. The method of claim 1, wherein cutting along the straight-line cut segments of the M straight-line cut segments which are not on the N straight-line chip boundary lines of the chip are performed with a laser beam and as deep as a Back End Of Line (BEOL) layer of the chip, and wherein cutting along the straight-line cut segments of the M straight-line cut segments which are on the N straight-line chip boundary lines of the chip are performed with a saw blade and as deep as entire the thickness of the chip.

9. A semiconductor wafer comprising a chip, the chip comprising a close-loop boundary line consisting of N straight-line chip boundary lines shared with N other chips of the wafer, N being a positive integer greater than 2, the chip further comprising cuts along M straight-line cut segments, M being a positive integer, wherein M>N.

10. The wafer of claim 9, wherein the angles of all corners of the chip are equal, wherein each corner of the corners of the chip is defined by two consecutive straight-line cut segments of the M straight-line cut segments.

11. The wafer of claim 9, wherein at least two consecutive straight-line cut segments of the M straight-line cut segments which are not on the N straight-line chip boundary lines of the chip are of a same length.

12. The wafer of claim 9, further comprising a Back End of Line (BEOL) layer which comprises a low-K material, wherein the BEOL layer resides at a top surface of the wafer.

13. A chip separation method comprising:

providing a wafer comprising a plurality of chips sharing straight-line chip boundary lines; and for each chip of the plurality of chips having a close-loop boundary line consisting of N straight-line chip boundary lines, N being an integer greater than 2, cutting around the chip along M straight-line cut segments on the chip, wherein M is an integer and M>N.

14. The method of claim 13, wherein the cutting of one chip of the plurality of chips is finished before the cutting of another chip of the plurality of chips is started.

15. The method of claim 13, wherein the cutting of one chip of the plurality of chips is started before the cutting of another chip of the plurality of chips is finished.

16. The method of claim 13, wherein the cutting is performed with a laser beam for straight-line cut segments of the plurality of straight-line cut segments which are not on any straight-line chip boundary line, and wherein the cutting is performed with a saw blade for all straight-line chip boundary lines comprising straight-line cut segments of the plurality of straight-line cut segments.

17. The method of claim 13, wherein for straight-line cut segments of the plurality of straight-line cut segments which are not on the straight-line chip boundary lines, the cutting is only as deep as a Back End of Line (BEOL) layer, and wherein for straight-line cut segments of the plurality of straight-line cut segments which are on the straight-line chip boundary lines, the cutting is as deep as the entire thickness of the wafer.

18. The method of claim 17, further comprising the step of cutting as deep as the entire thickness of the wafer along all the straight-line chip boundary lines.

19. The method of claim 13, wherein the plurality of chips are arranged in rows and columns, and wherein at least one straight-line chip boundary line goes through at least two straight-line cut segments of at least two chips of the plurality of chips.

20. The method of claim 13, wherein the straight-line cut segments of the plurality of straight-line cut segments which are not on any straight-line chip boundary line of the chip are of a same length.

* * * * *

UNITED STATES PATENT AND TRADEMARK OFFICE
CERTIFICATE OF CORRECTION

PATENT NO. : 6,924,210 B1
DATED : August 2, 2005
INVENTOR(S) : Daubenspeck et al.

It is certified that error appears in the above-identified patent and that said Letters Patent is hereby corrected as shown below:

Column 2,
Line 64, delete "supra" and insert -- *supra* --.

Column 5,
Line 41, delete "as entire the" and insert -- as the entire --.

Signed and Sealed this

Twenty-seventh Day of September, 2005

JON W. DUDAS
*Director of the United States Patent and Trademark Office*